United States Patent
Kishi et al.

(10) Patent No.: US 11,513,172 B2
(45) Date of Patent: Nov. 29, 2022

(54) POSITION SENSOR AND POSITION DETECTION METHOD

(71) Applicant: TOYO DENSO KABUSHIKI KAISHA, Tokyo (JP)

(72) Inventors: Shoji Kishi, Saitama (JP); Takayuki Otani, Saitama (JP); Toshikazu Murata, Saitama (JP)

(73) Assignee: TOYO DENSO KABUSHIKI KAISHA, Tokyo (JP)

( * ) Notice: Subject to any disclaimer, the term of this patent is extended or adjusted under 35 U.S.C. 154(b) by 113 days.

(21) Appl. No.: 17/027,746

(22) Filed: Sep. 22, 2020

(65) Prior Publication Data

US 2021/0181274 A1    Jun. 17, 2021

(30) Foreign Application Priority Data

Dec. 12, 2019    (JP) .............................. JP2019-224544

(51) Int. Cl.
*G01R 33/09*    (2006.01)
*B62K 11/14*    (2006.01)

(52) U.S. Cl.
CPC ............ *G01R 33/091* (2013.01); *B62K 11/14* (2013.01)

(58) Field of Classification Search
CPC .............. G01D 5/145; G01D 2205/40; G01D 2205/80; G01D 5/165; G01D 5/147; G01R 33/091; B62K 11/14
See application file for complete search history.

(56) References Cited

U.S. PATENT DOCUMENTS

| 6,911,798 B2 * | 6/2005 | Hori ....................... G01D 5/242 |
| | | 318/602 |
| 7,268,538 B2 * | 9/2007 | Johnson ................. G01D 5/145 |
| | | 324/207.2 |
| 2006/0038557 A1 * | 2/2006 | Johnson ................. G01D 5/145 |
| | | 324/207.25 |
| 2006/0081218 A1 * | 4/2006 | Hino ...................... F02D 11/107 |
| | | 324/207.2 |
| 2011/0068780 A1 * | 3/2011 | Sakai ...................... G01D 5/145 |
| | | 324/207.25 |

(Continued)

FOREIGN PATENT DOCUMENTS

DE       198 23 089 A1    12/1998
DE    10 2015 105854 A1    10/2016

(Continued)

OTHER PUBLICATIONS

The Extended European Search Report mailed by European Patent Office dated Feb. 26, 2021 in corresponding European patent application No. 20199240.1-1010.

*Primary Examiner* — Alesa Allgood
(74) *Attorney, Agent, or Firm* — IP Business Solutions, LLC

(57) ABSTRACT

A position sensor according to the present invention includes: a magnet configured to move together with a moving body and generate a first magnetic flux along a specific movement direction of the moving body and a second magnetic flux along the opposite direction to the specific movement direction of the moving body; and a sensor configured to detect the direction of the first magnetic flux and the direction of the second magnetic flux. The magnet is configured by at least one magnet having at least two pairs of magnetic poles to be paired formed thereon.

8 Claims, 10 Drawing Sheets

[MAGNETIC POLES OF MAGNET]

[DETECTION OF MAGNETIC FLUX DIRECTIONS]

(56) References Cited

U.S. PATENT DOCUMENTS

| | | |
|---|---|---|
| 2012/0038348 A1 | 2/2012 | Aimuta |
| 2012/0038351 A1* | 2/2012 | Saruki ................... G01D 5/145 |
| | | 324/207.25 |
| 2013/0257416 A1* | 10/2013 | Nomura ................ B62K 23/04 |
| | | 324/207.13 |

FOREIGN PATENT DOCUMENTS

| | | |
|---|---|---|
| EP | 1 647 808 A1 | 4/2006 |
| EP | 1 777 501 A1 | 4/2007 |
| EP | 2 302 330 A2 | 3/2011 |
| EP | 2 644 870 A1 | 10/2013 |
| JP | 2014-104869 A | 6/2014 |

* cited by examiner

Fig.2
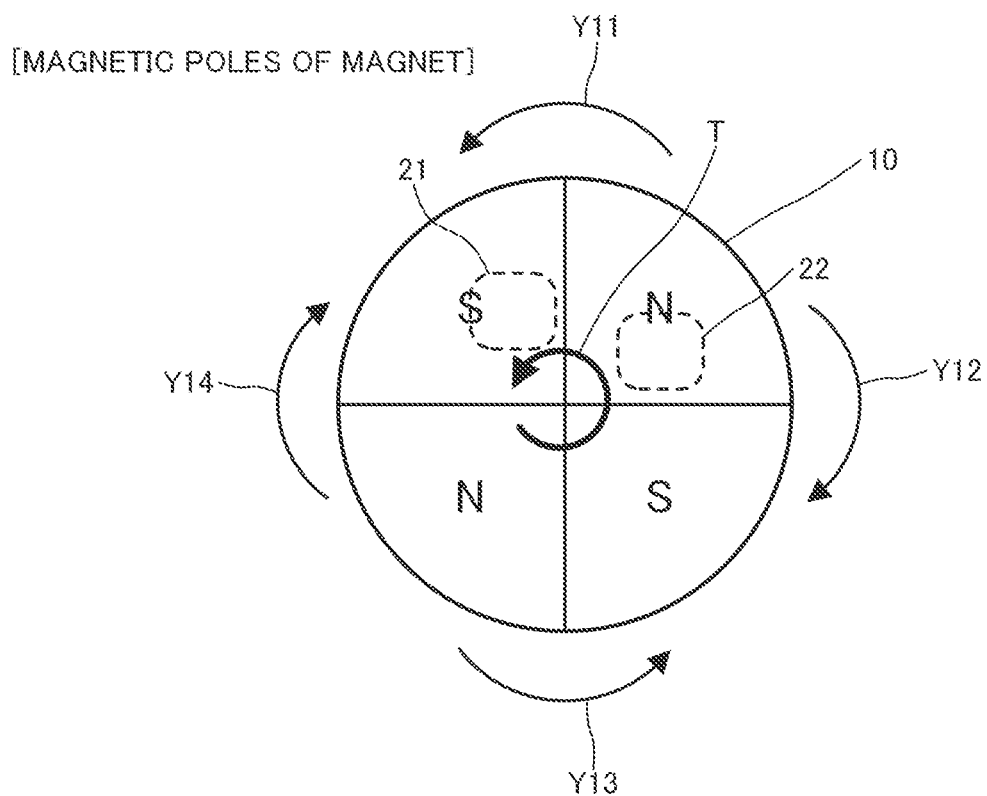
[MAGNETIC POLES OF MAGNET]
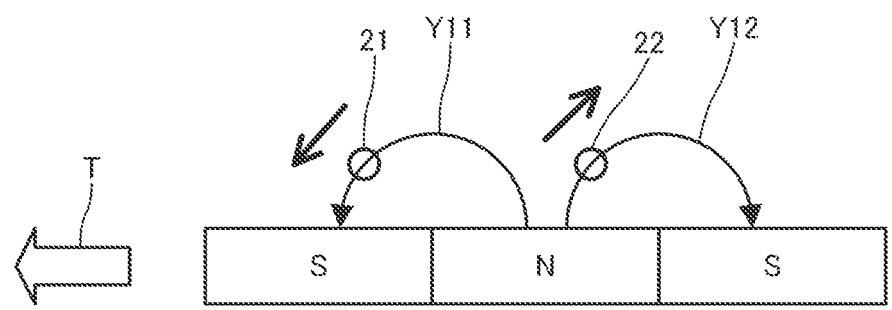
[DETECTION OF MAGNETIC FLUX DIRECTIONS]

Fig.5
[NOT INFLUENCED BY EXTERNAL MAGNETIC FIELD]
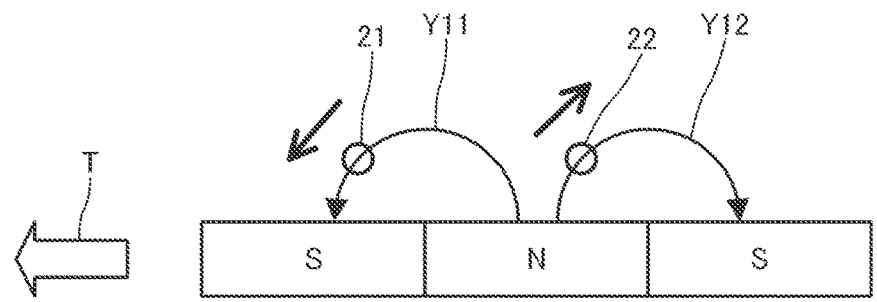
[INFLUENCED BY EXTERNAL MAGNETIC FIELD 1]
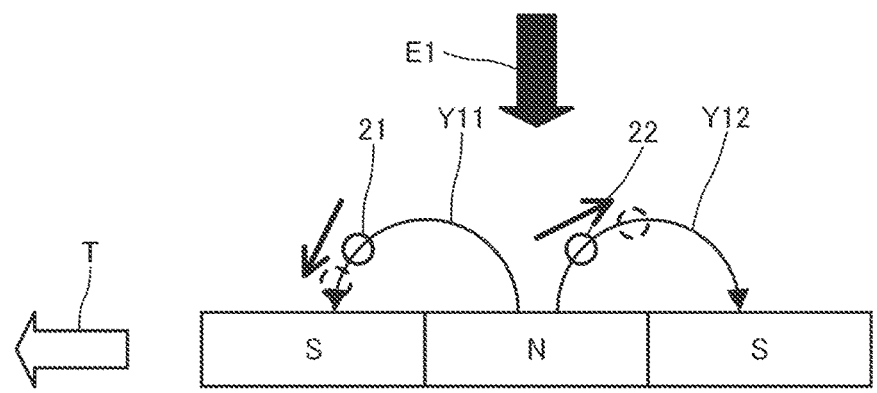
[INFLUENCED BY EXTERNAL MAGNETIC FIELD 2]
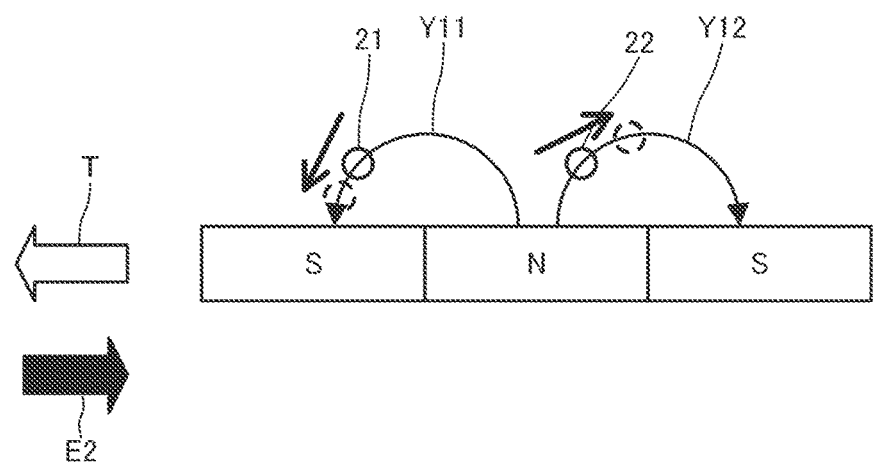

Fig.6
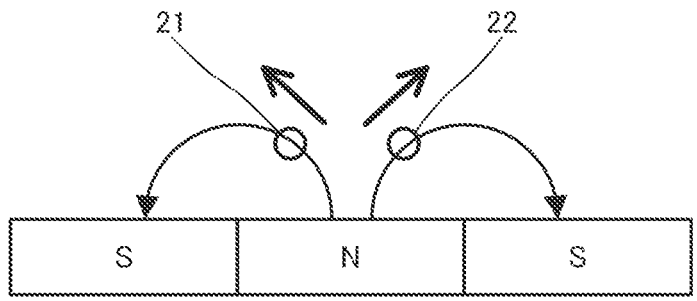
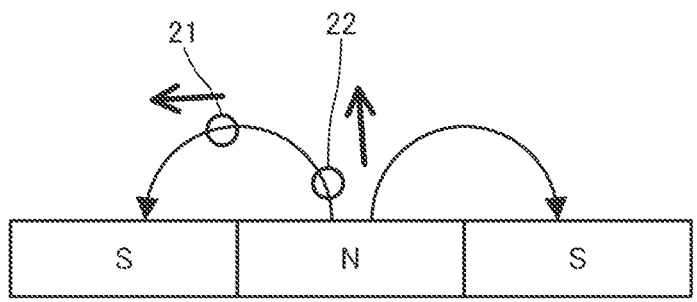
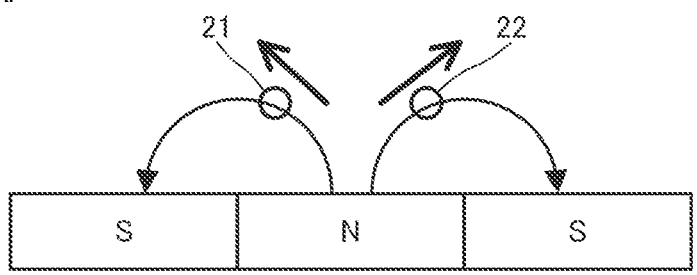
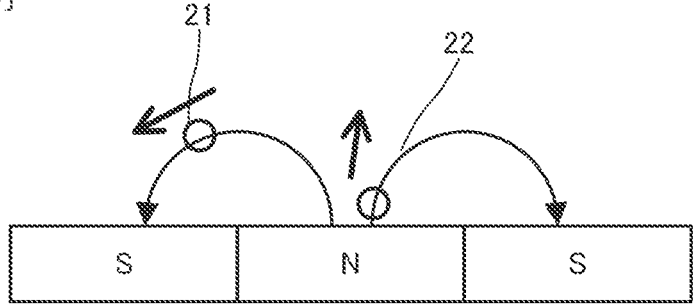

Fig.7
[180°]
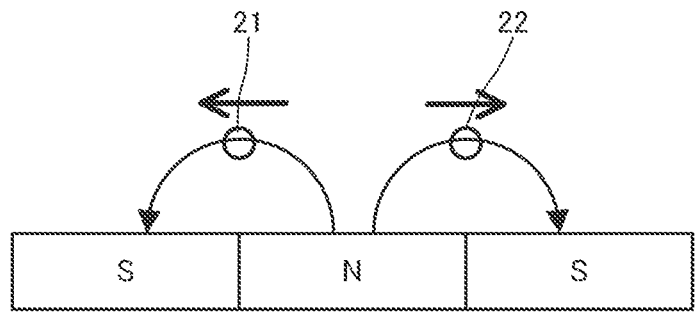
[180~270°(1)]
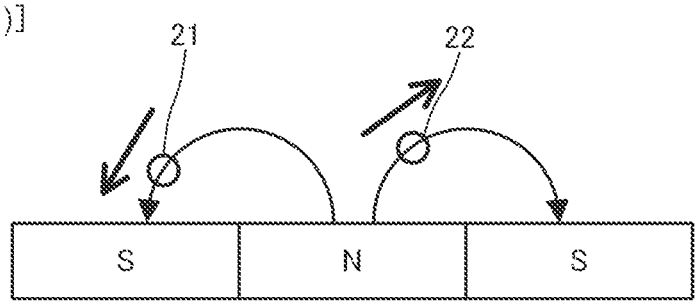
[180~270°(2)]
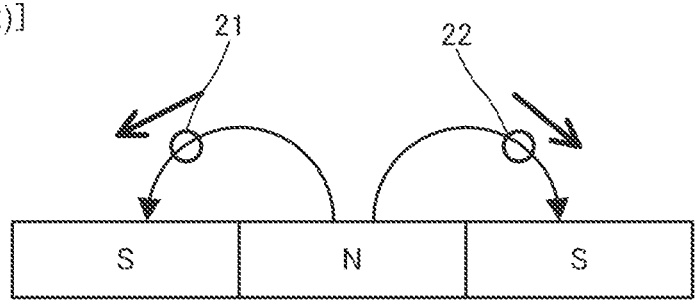
[270°]
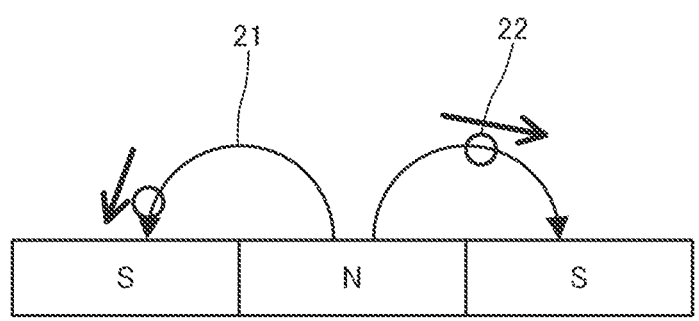

POSITION SENSOR AND POSITION DETECTION METHOD

INCORPORATION BY REFERENCE

The present invention is based upon and claims the benefit of priority from Japanese patent application No. 2019-224544, filed on Dec. 12, 2019, the disclosure of which is incorporated herein in its entirety by reference.

TECHNICAL FIELD

The present invention relates to a position sensor and a position detection method for detecting the position of a moving body.

BACKGROUND ART

On a motorcycle, a driver mainly rotates a throttle grip and thereby adjusts an accelerator opening to operate an accelerator. An accelerator opening is detected by detection of the rotation angle of a throttle grip. Meanwhile, in recent years, an accelerator opening is often detected by detection of a magnetic flux generated by a magnet rotating together with a throttle grip by a magnetic sensor.

Patent Document 1 discloses an example of a device that detects an accelerator opening. To be specific, the device disclosed by Patent Document 1 includes a magnet that rotates in conjunction with a grip slave, and a magnetic sensor provided near the magnet. The device includes two magnetic sensors each detecting the direction of a magnetic flux, and an accelerator opening is obtained based on values output by the two magnetic sensors.

Patent Document 1: Japanese Unexamined Patent Application Publication No. JP-A 2014-104869

In the case of detecting an accelerator opening by using a magnetic sensor as described above, the presence of an external magnetic field is a problem. That is to say, there arises a problem that the magnetic field of a rotating magnet is influenced by an external magnetic field and a magnetic sensor for detecting an accelerator opening cannot properly detect the rotation angle of a throttle grip.

In order to deal with the problem, the device disclosed by Patent Document 1 further includes a third magnetic sensor for detecting a magnetic flux density. Then, based on the values output by the abovementioned two magnetic sensors each detecting the direction of a magnetic flux and a value output by the one magnetic sensor detecting a magnetic flux density, the influence of an external magnetic field is detected.

In the technique of Patent Document 1 described above, for the purpose of detecting the influence of an external magnetic field in a configuration of detecting the rotation angle of a rotating body, that is, a throttle grip by using magnetic sensors, three magnetic sensors are mounted. Consequently, there arises a problem of increase in the number of parts and complication of the structure. Besides, the abovementioned problem may arise not only in detecting the rotation angle of a throttle grip but also in detecting the rotation angle of any rotating body or even in detecting the position of any moving body along its movement direction.

SUMMARY

Accordingly, an object of the present invention is to provide a position sensor and a position detection method that can solve the abovementioned problem, that is, complication of the structure and increase in the number of parts in the case of detecting the position of a moving body and detect the influence of an external magnetic field.

A position sensor according to an aspect of the present invention includes a magnet and a sensor. The magnet is configured to move together with a moving body and generate a first magnetic flux along a specific movement direction of the moving body and a second magnetic flux along an opposite direction to the specific movement direction of the moving body, The sensor is configured to detect a direction of the first magnetic flux and a direction of the second magnetic flux. The magnet is configured by at least one magnet having at least two pairs of magnetic poles to be paired formed thereon.

Further a position detection method according to the present invention includes detecting a direction of a first magnetic flux and a direction of a second magnetic flux. The first magnetic flux and the second magnetic flux are generated by at least one magnet moving together with a moving body and having at least two pairs of magnetic poles to be paired formed thereon. The first magnetic flux is along a specific movement direction of the moving body. The second magnetic flux is along an opposite direction to the specific movement direction of the moving body.

With the configurations as described above, the present invention can realize detection of the position of a moving body with a simple structure, and can solve the problem of increase in the number of parts and detect the influence of an external magnetic field.

BRIEF DESCRIPTION OF DRAWINGS

FIG. 2 is a view showing an example of arrangement of a magnet and a magnetic sensor that configure the position sensor disclosed in FIG. 1;

FIG. 5 is a view showing an example of the influence of an external magnetic field in a case where the direction of a magnetic flux is detected by the magnetic sensor configuring the position sensor disclosed in FIG. 1;

FIG. 6 is a view showing an example of arrangement of the magnet and the magnetic sensor that configure the position sensor disclosed in FIG. 1;

FIG. 7 is a view showing an example of arrangement of the magnet and the magnetic sensor that configure the position sensor disclosed in FIG. 1;

EXAMPLE EMBODIMENTS

First Example Embodiment

Figure 8:
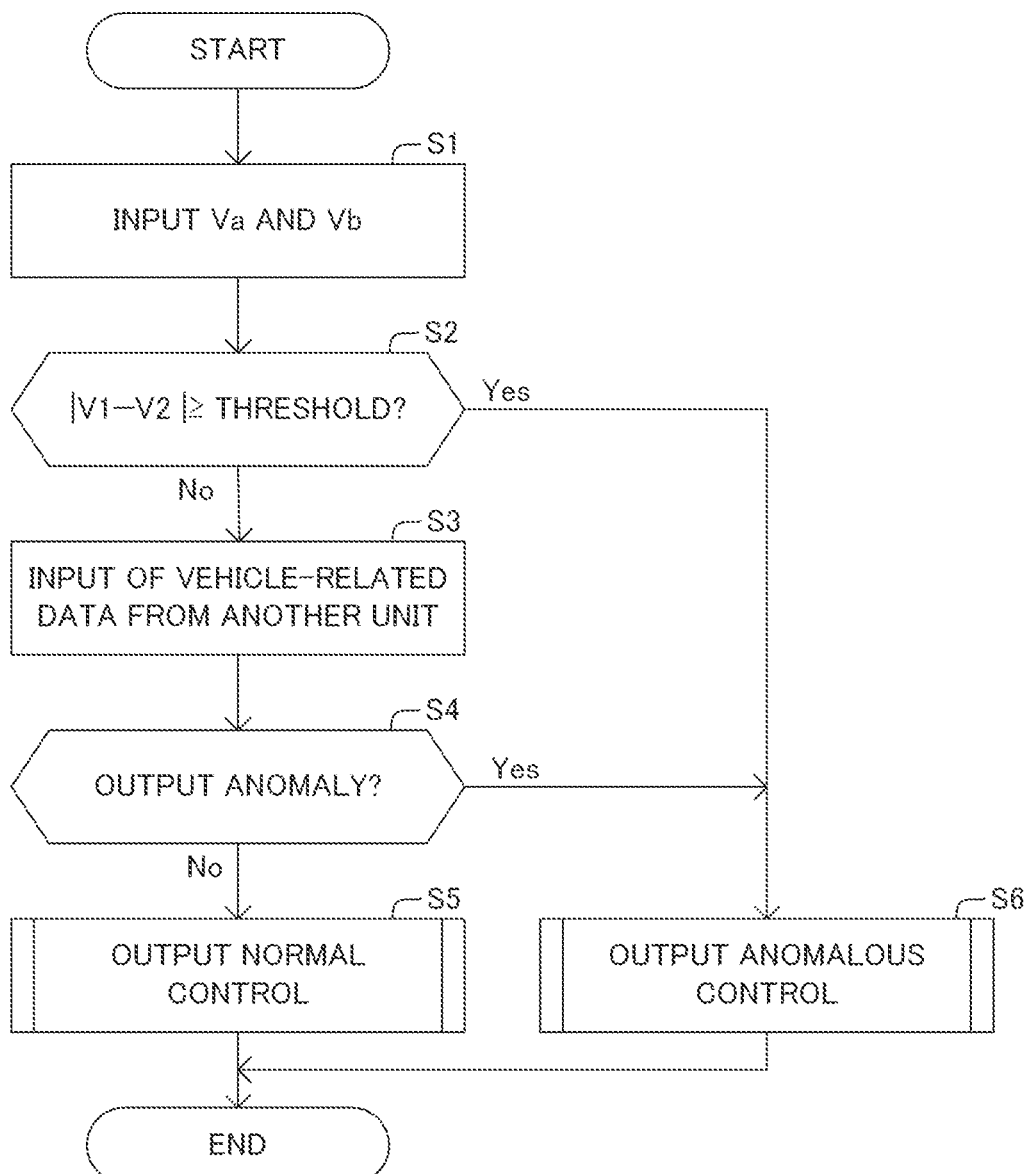
FIG. 8 is a flowchart showing the operation of the position sensor disclosed in FIG. 1.
Figure 9:
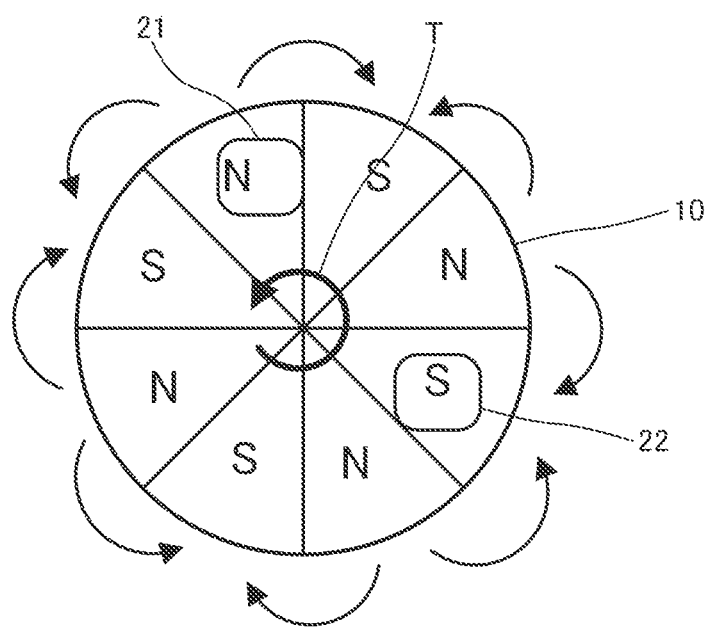
FIG. 9 is a view showing another configuration example of the magnet configuring the position sensor disclosed in FIG. 1.
Figure 10:
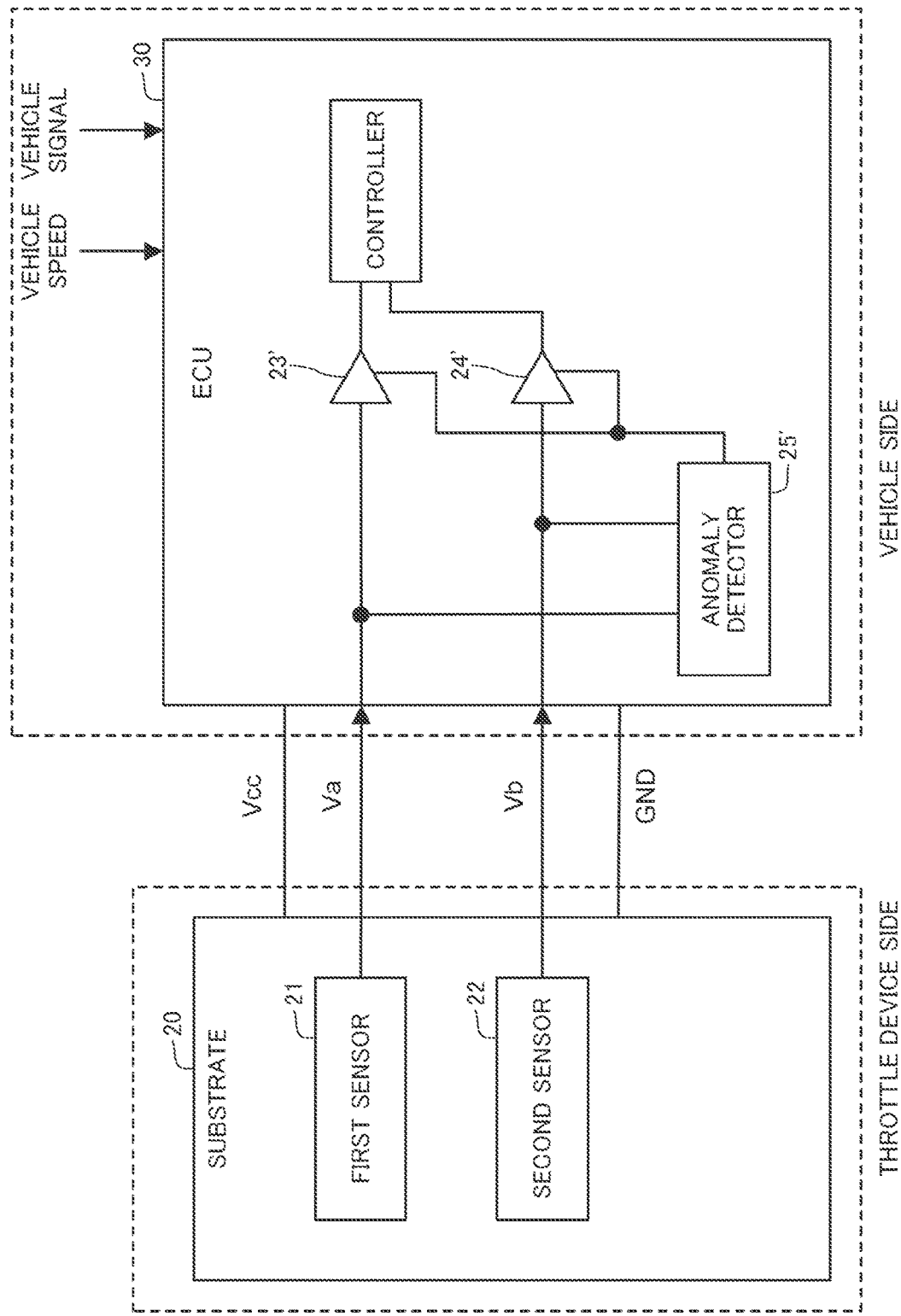
FIG. 10 is a block diagram showing another configuration of the position sensor disclosed in FIG. 1.

A first example embodiment of the present invention will be described with reference to FIGS. 1 to 10. FIGS. 1 to 7 are views for describing a configuration of a position sensor, and FIG. 8 is a view for describing an operation of the position sensor. FIGS. 9 and 10 are views for describing another configuration of the position sensor.

[Configuration]

Figure 1:
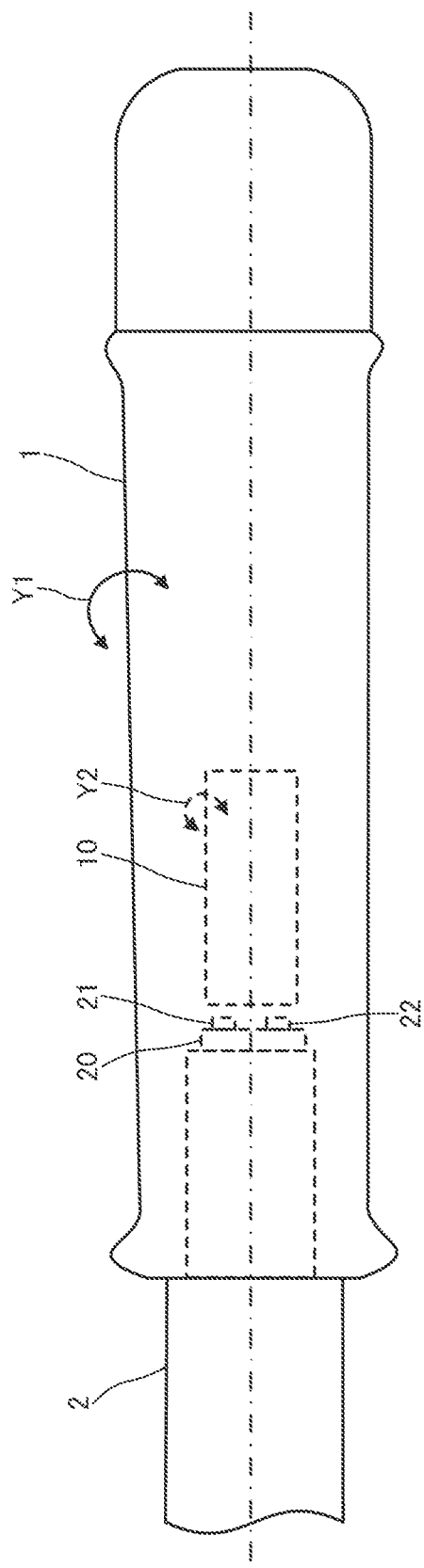
FIG. 1 is a view showing the outline of the configuration of a throttle device equipped with a position sensor in a first example embodiment of the present invention.

The position sensor in this example embodiment is a device for detecting the degree of rotation, that is, a rotation position in a rotation direction (a position) of a rotating body. Specifically, as shown in FIG. 1, the position sensor in this example embodiment is mounted on a throttle device for operating an accelerator of a motorcycle and is for detecting the rotation angle of a throttle grip. The position sensor in this example embodiment further has a function of detecting the influence of an external magnetic field. However, the position sensor according to the present invention is not necessarily limited to being mounted on a throttle device, and may be used for detecting the rotation position of any rotating body. Moreover, the position sensor of the present invention is not limited to being used for detecting the rotation position of a rotating body, and may be used for detecting the movement position of a moving body as will be described later.

FIG. 1 shows the outline of a configuration of a throttle device in this example embodiment. The throttle device includes a throttle grip 1 having a substantially cylindrical shape attached to a handlebar 2 of a motorcycle. The throttle grip 1 forms a rotating body that is rotatable in a specific rotation direction as indicated by arrow Y1 in FIG. 1 about a central axis along the longitudinal direction of the substantially cylindrical shape with respect to the handlebar 2. For example, when the operator does not operate the throttle grip 1, the throttle grip 1 is in a state of being stopped at a preset rotation position and, when the operator grasps and rotationally operates the throttle grip 1 in the specific rotation direction, the throttle grip 1 is rotated to a rotation position corresponding to the status of rotational operation.

The throttle device is equipped with a position sensor that detects the rotation position of the throttle grip 1. As shown in FIG. 1, the position sensor includes a magnet 10 that rotates together with the throttle grip 1, and a substrate 20 that includes a first sensor 21 and a second sensor 22 each detecting the direction of a magnetic flux generated by the magnet 10. The substrate 20 is fixedly mounted on the handlebar 2 and does not rotate unlike the throttle grip 1. Hereinafter, the respective components will be described in detail.

The magnet 10 has a substantially cylindrical shape and, as shown in FIG. 1, is attached inside the throttle grip 1 coaxially with the rotation axis of the throttle grip 1. Therefore, the magnet 10 is rotated at the same rotation angle as the rotation angle of the throttle grip 1 as indicated by arrow Y2, in conjunction with the rotation of the throttle grip 1 about the rotation axis. At this time, the magnet 10 has, on the side of the handlebar 2, an end surface along a plane that is substantially orthogonal to the rotation axis of the throttle grip 1, and the end surface rotates about the rotation axis. Although the end surface of the magnet 10 is preferably formed along the plane orthogonal to the rotation axis of the throttle grip 1, the end surface may be formed so as to be inclined within a predetermined angle range with respect to the plane orthogonal to the rotation axis as long as the first sensor 21 and the second sensor 22 can detect the directions of magnetic fluxes generated by the magnet 10.

The structure of the magnet 10 will be further described with reference to FIG. 2. FIG. 2 shows the end surface on the side of the handlebar 2 of the magnet 10. As shown in this figure, the end surface of the magnet 10 is formed so as to have four magnetic poles radially divided. That is to say, the end surface of the magnet 10 is radially divided into four, and the N poles and the S poles are alternately formed in order in the circumferential direction. Consequently, on the end surface of the magnet 10, the N pole and the S pole adjacent to each other form a pair of magnetic poles, and magnetic fluxes heading from the N poles to the S poles are generated on the pairs of magnetic poles as indicated by arrows Y11 to Y14 in FIG. 2.

Since the magnet 10 is radially divided and has the magnetic poles as described above, the direction of the magnetic flux generated on the pair of magnetic poles is a direction along a rotation direction T of the end surface of the magnet 10 or a direction along the opposite direction to the rotation direction T. For example, in the example of FIG. 2, the magnetic flux in a direction indicated by arrow Y11 (first magnetic flux) is generated in the direction along the rotation direction T, and the magnetic flux in a direction indicated by arrow Y12 (second magnetic flux) is generated in the direction along the opposite direction to the rotation direction T. That is to say, the magnet 10 is configured to generate magnetic fluxes that head opposite each other with respect to the rotation direction.

Next, the configuration of the substrate 20 configuring the position sensor will be described in detail. The substrate 20 includes the first sensor 21 and the second sensor 22 (sensor) that are placed so as to detect the directions of the magnetic fluxes along the mutually opposite directions on the magnet 10, respectively. The first sensor 21 and the second sensor 22 are configured by, for example, a Hall element, a magneto-resistive effect element, a magneto-impedance element, or a superconducting quantum interference element. However, the first sensor 21 and the second sensor 22 are not limited to being configured by the abovementioned elements, and may be any magnetic sensor configured to output a detection value corresponding to a magnetic flux direction.

To be specific, as shown in FIG. 1, the first sensor 21 and the second sensor 22 are placed so as to face the end surface of the magnet 10 on which the magnetic poles are formed. Then, as shown in the upper view of FIG. 2, the first sensor 21 is placed so as to detect a magnetic flux direction along the rotation direction T indicated by arrow Y11, and the second sensor 22 is placed so as to detect a magnetic flux direction along the opposite direction to the rotation direction T indicated by arrow Y12.

The placement of the first sensor 21 and the second sensor 22 will be further described with reference to the lower view of FIG. 2. The lower view of FIG. 2 illustrates a case where it is assumed that the pairs of magnetic poles generating magnetic fluxes in directions of arrow Y11 and arrow Y12, respectively, on the end surface of the magnet 10 are placed on the same straight line. That is to say, as shown in the lower view of FIG. 2, a case where S poles are placed on both the sides across one N pole. In such placement of the magnetic poles, the first sensor 21 is placed on the S pole located on the forward side in the rotation direction T with respect to the N pole, and the second sensor 22 is placed on the N pole and closer to the S pole located on the reverse side in the rotation direction T with respect to the N pole. Consequently, the first sensor 21 can detect the magnetic flux in the direction of arrow Y11, and the second sensor 22 can detect the magnetic flux in the direction of arrow Y12.

Next, with reference to FIG. 3, another configuration of the substrate 20 will be described in detail. The substrate 20 is connected to an ECU (Engine Control Unit) 30 mounted on the side of a vehicle, that is, a motorcycle, and is supplied with power. The substrate 20 includes the first sensor 21 and the second sensor 22 as described above, and includes amplifiers 23 and 24 that amplify voltage values that are values detected by the first sensor 21 and the second sensor 22, respectively. The substrate 20 is connected to the ECU 30 via a signal line, and is configured to be able to input voltage values Va and Vb detected by the first sensor 21 and the second sensor 22 and amplified by the amplifiers 23 and 24, into the ECU 30.

The respective amplifiers 23 and 24 amplify the respective detection values so that the relation between the value detected by the first sensor 21 and the value detected by the second sensor 22 is a preset relation in accordance with the rotation angle of the magnet 10. For example, the amplifiers 23 and 24 are configured to amplify the voltage values so as to increase at the same increase rate in accordance with increase of the rotation angle of the magnet 10 as indicated by solid lines denoted by reference symbols Va and Vb in FIG. 4. That is to say, the amplifiers 23 and 24 amplify the detection values so that the difference between the amplified voltage values Va and Vb becomes almost constant at the same rotation angle of the magnet 10. Therefore, the amplifiers 23 and 24 are configured so that the absolute value of the difference between the value detected by the first sensor 21 and the value detected by the second sensor 22 is smaller than a set threshold value.

Further, the substrate 20 includes an anomaly detection circuit 25 (detector) configured by an electronic circuit. The anomaly detection circuit 25 has a function of detecting the influence of an external magnetic field by using voltage values that are values detected by the first sensor 21 and the second sensor 22. To be specific, the anomaly detection circuit 25 converts detection values detected by the first sensor 21 and the second sensor 22 into the voltage values Va and Vb so as to become amplified values in the same manner as the amplifiers 23 and 24 mounted on the substrate 20, and examines change in the relation between the voltage values Va and Vb. Herein, the relation between the voltage values Va and Vb is set such that the absolute value of the difference between the voltage values Va and Vb is smaller than the threshold value. Therefore, the anomaly detection circuit 25 examines whether the relation is satisfied or not. In a case where the relation that the absolute value of the difference between the voltage values Va and Vb is smaller than the threshold value is not satisfied, the anomaly detection circuit 25 detects that there is the influence of an external magnetic field.

The method for detecting the influence of an external magnetic field by the anomaly detection circuit 25 will be further described. First, in the absence of an external magnetic field, the voltage values Va and Vb when the first sensor 21 and the second sensor 22 detect the directions of magnetic fluxes of mutually opposite directions generated by the magnet 10 have a constant difference as indicated by solid lines and broken lines in FIG. 4. At this time, when an external magnetic field occurs, an external magnetic field of the same direction is applied to each of the first sensor 21 and the second sensor 22. Since the first sensor 21 and the second sensor 22 have detected the magnetic fluxes of the mutually opposite directions, changes of the voltage values that are the detection values are opposite to those before. For example, the voltage value Va from the first sensor 21 changes so as to have a larger inclination as indicated by reference symbol Va' in FIG. 4, whereas the voltage value Vb from the second sensor 22 changes so as to have a smaller inclination as indicated by reference symbol Vb' in FIG. 4. Therefore, when an external magnetic field is applied, the absolute value of the difference between the voltage values Va and Vb detected by the first sensor 21 and the second sensor 22 becomes larger and may be equal to or larger than a preset threshold value.

Then, the anomaly detection circuit 25 controls the output of the voltage values Va and Vb detected by the first sensor 21 and the second sensor 22, depending on whether the influence of an external magnetic field is detected or not. For example, when the anomaly detection circuit 25 does not detect the influence of an external magnetic field, the anomaly detection circuit 25 does not engage in the output of the voltage values Va and Vb to the ECU 30. As a result, the substrate 20 outputs the voltage values Va and Vb detected by the first sensor 21 and the second sensor 22 to the ECU 30, and the ECU 30 performs throttle control for a throttle opening corresponding to the voltage values. On the other hand, when the anomaly detection circuit 25 detects the influence of an external magnetic field, the anomaly detection circuit 25 outputs anomaly signals to the amplifiers 23 and 24, for example. Thus, the amplifiers 23 and 24 set the voltage values Va and Vb detected by the first sensor 21 and the second sensor 22 to LOW level, and output to the ECU 30. Consequently, the ECU 30 executes control set in case of anomaly detection such as the throttle control being stopped. In a case where the anomaly detection circuit 25 detects the influence of an external magnetic field, the anomaly detection circuit 25 may output an anomaly signal directly to the ECU 30 or another device, or may perform another process to notify the anomaly.

What occurs when the first sensor 21 and the second sensor 22 detect an external magnetic field will be further described. FIG. 5 shows examples of magnetic flux directions detected by the first sensor 21 and the second sensor 22 in the presence of the influence of an external magnetic field, by thick line arrows. First, the upper view of FIG. 5 shows a case where there is no influence of an external magnetic field. On the other hand, the middle view of FIG. 5 shows a case where the magnetic flux directions are influenced by an external magnetic field E1 of a direction perpendicular to the rotation direction T, that is, heading from the top to the bottom in the figure. As shown in this figure, due to the external magnetic field E1, the magnetic flux direction detected by the first sensor 21 is such that the downward magnetic flux is stronger as indicated by thick line arrow, which has a positive influence on the detected rotation direction T. That is to say, the first sensor 21 detects a value to be detected when the first sensor 21 is located forward in the rotation direction T with respect to its actual position, as indicated by dotted line. On the other hand, due to the external magnetic field E1, the magnetic flux direction detected by the second sensor 22 is such that the upward magnetic flux is weaker as indicated by thick line arrow, which has a negative influence on the rotation direction T. That is to say, the second sensor 22 detects a value to be detected when the second sensor 22 is located backward in the rotation direction T with respect to its actual position, as indicated by dotted line. Thus, in the presence of the influence of the external magnetic field E1, the first sensor 21 and the second sensor 22 detect the magnetic flux directions influenced and changed in the mutually opposite directions as compared with the case where there is no influence of an external magnetic field.

Further, the lower view of FIG. 5 shows a case where there is the influence of an external magnetic field E2 whose magnetic flux direction is opposite the rotation direction T. As shown in this figure, due to the external magnetic field E2, the magnetic flux direction detected by the first sensor 21 is such that the magnetic flux in the rotation direction T is weaker as indicated by thick line arrow, which has a positive influence on the rotation direction T. That is to say, the first sensor 21 detects a value to be detected when the first sensor 21 is located forward in the rotation direction T with respect to its actual position, as indicated by dotted line. On the other hand, due to the external magnetic field E2, the magnetic flux direction detected by the second sensor 22 is such that the magnetic flux in the opposite direction to the rotation direction T is stronger as indicated by thick line arrow, which has a negative influence on the rotation direction T. That is to say, the second sensor 22 detects a value to be detected when the second sensor 22 is located backward in the rotation direction T with respect to its actual position, as indicated by dotted line. Thus, in a case where there is the influence of the external magnetic field E2, the first sensor 21 and the second sensor 22 detect the magnetic flux directions influenced and changed in the mutually opposite directions as compared with the case where there is no influence of an external magnetic field.

In the above example of FIG. 5, a case is illustrated where the angle between the magnetic flux directions detected by the first sensor 21 and the second sensor 22 is 180°, but the angle between the magnetic flux directions detected by the first sensor 21 and the second sensor 22 may be any angle. However, as will be described below, it is desirable that the angle between the magnetic flux directions detected by the first sensor 21 and the second sensor 22 is in a range between 90° and 270° (larger than 90° and smaller than 270°), and it is preferable to arrange the first sensor 21 and the second sensor 22 with respect to the magnetic poles of the magnet 10 so as to have such an angle. Moreover, it is more desirable to arrange the first sensor 21 and the second sensor 22 so as to face different poles (N pole and S pole) within the abovementioned angle range.

To be specific, first, FIG. 6 shows two cases where the angle between the magnetic flux directions detected by the first sensor 21 and the second sensor 22 is 90°. In the example of 90° (1), the two sensors 21 and 22 are located on one pole (N pole), and it can be said that an external magnetic field of the rotation direction T (horizontal direction in the figure) is unlikely to cause the output difference between the values detected by the first sensor 21 and the second sensor 22. In the example of 90° (2), the two sensors 21 and 22 are located on the N pole and the S pole, respectively, and it can be said that an external magnetic field of the perpendicular direction to the rotation direction T (vertical direction in the figure) is unlikely to cause the output difference between the values detected by the first sensor 21 and the second sensor 22. Although not shown, it can be said that the same applies to cases where the angle between the magnetic flux directions detected by the first sensor 21 and the second sensor 22 is in the range between 0° and 90°.

Further, FIG. 6 shows two cases in which the angle between the magnetic flux directions detected by the first sensor 21 and the second sensor 22 is in the range from 90 to 180°. In the example of 90 to 180° (1), the two sensors 21 and 22 are located on one pole (N pole). In this case, it can be said that the external magnetic field of the rotation direction T (horizontal direction in the figure) is unlikely to cause the output difference between the values detected by the first sensor 21 and the second sensor 22. On the other hand, in the example of 90 to 180° (2), the two sensors 21 and 22 are located on the N pole and the S pole, respectively. In this case, it can be said that an external magnetic field of any direction is likely to cause the output difference between the values detected by the first sensor 21 and the second sensor 22.

Next, in FIG. 7, a case is illustrated where the angle between the magnetic flux directions detected by the first sensor 21 and the second sensor 22 is 180° and the two sensors 21 and 22 are each located on the boundary between the N pole and the S pole. In this case, it can be said that an external magnetic field of any direction is likely to cause the output difference between the values detected by the first sensor 21 and the second sensor 22. In the case where the two sensors 21 and 22 are located on the N pole and the S pole, respectively, as already described above with reference to FIG. 5, it can be said that an external magnetic field of any direction is likely to cause the output difference of the values detected by the first sensor 21 and the second sensor 22.

Further, FIG. 7 shows two cases where the angle between the magnetic flux directions detected by the first sensor 21 and the second sensor 22 is in the range from 180 to 270°. In the example of 180° to 270° (1), the two sensors 21 and 22 are located on the N pole and the S pole, respectively. In this case, it can be said that an external magnetic field of any direction is likely to cause the output difference between the values detected by the first sensor 21 and the second sensor 22. On the other hand, in the example of 180° to 270° (2), the two sensors 21 and 22 are located on one pole (S pole). In this case, it can be said that the external magnetic field in the rotation direction T (horizontal direction in the figure) is unlikely to cause the output difference between the values detected by the first sensor 21 and the second sensor 22.

Further, FIG. 7 shows a case where the angle between the magnetic flux directions detected by the first sensor 21 and the second sensor 22 is 270°. In this example, the two sensors 21 and 22 are located on one pole (S pole). In this case, it can be said that the external magnetic field of the rotation direction T (horizontal direction in the figure) is unlikely to cause the output difference between the values detected by the first sensor 21 and the second sensor 22. Although not shown, in a case where the angle between the magnetic flux directions detected by the first sensor 21 and the second sensor 22 is 270° and the two sensors 21 and 22 are located on the N pole and the S pole, respectively, it can also be said that the output difference is unlikely to be caused. Besides, although not shown, the same applies to cases where the angle between the magnetic flux directions detected by the first sensor 21 and the second sensor 22 is in the range between 270° and 360°.

[Operation]

Next, the operation of the abovementioned position sensor will be described mainly with reference to the flowchart of FIG. 8. First, the first sensor 21 and the second sensor 22 detect at all times the directions of magnetic fluxes generated by the magnet 10 rotating in conjunction with the rotation of the throttle grip 1, and output the detection values to the anomaly detection circuit 25. The anomaly detection circuit 25 converts the detection values detected by the first sensor 21 and the second sensor 22 into voltage values Va and Vb so as to become amplified values in the same manner as the amplifiers 23 and 24 mounted on the substrate 20, and inputs the voltage values Va and Vb (step S1).

Figure 4:
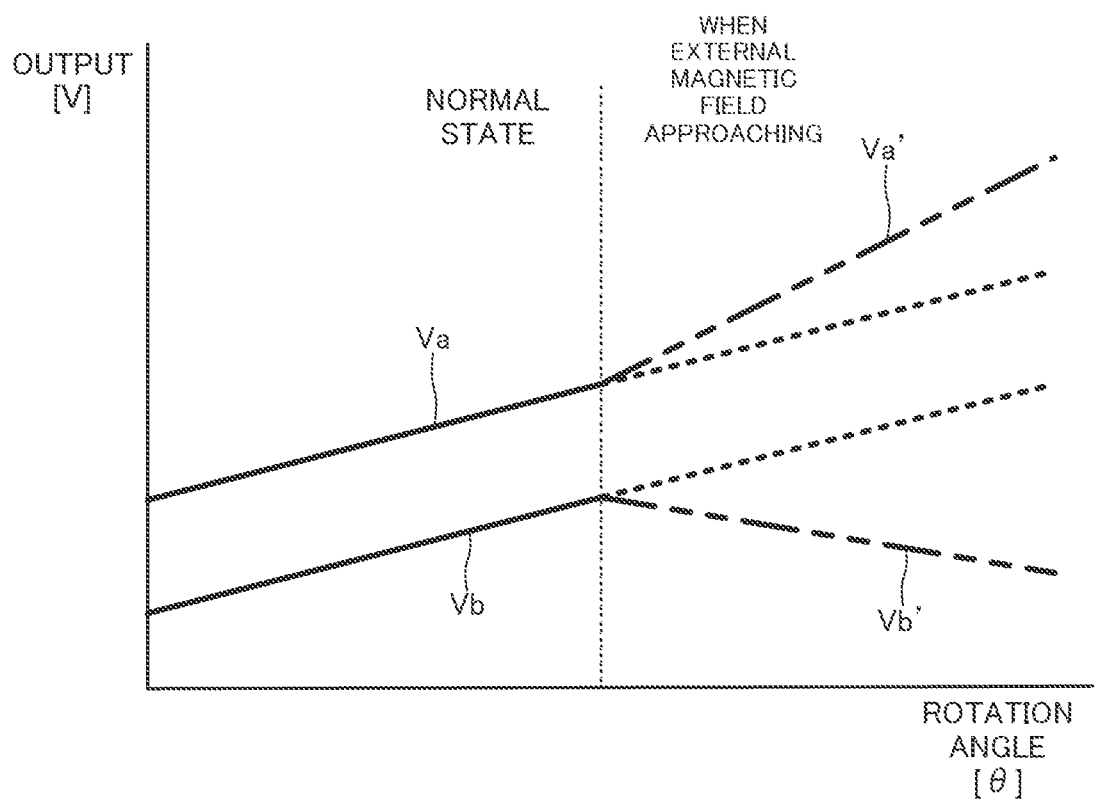
FIG. 4 is a view showing an example of a detection value when the direction of a magnetic flux is detected by the magnetic sensor configuring the position sensor disclosed in FIG. 1.

Then, the anomaly detection circuit 25 checks the change in the relation between the voltage values Va and Vb. To be specific, the anomaly detection circuit 25 checks whether the relation that the absolute value of the difference between the voltage values Va and Vb is smaller than the threshold value is satisfied or not (step S2). In a case where the absolute value of the difference between the voltage values Va and Vb is smaller than the threshold value (No in step S2), that is, in a case where the change in the graph as shown in the normal state of FIG. 4 is seen, the anomaly detection circuit 25 does not detect the influence of an external magnetic field. In this case, the voltage values Va and Vb obtained by amplifying the detection values detected by the first sensor 21 and the second sensor 22 by the amplifiers 23 and 24 are output from the substrate 20 to the ECU 30.

Subsequently, the ECU 30 receives input of vehicle-related data such as vehicle speed and a predetermined vehicle signal from another unit, (step S3), and determines based on the data whether or not the accelerator position sensor output is anomalous (Step S4). When the ECU 30 determines that the accelerator position sensor output is not anomalous (No at step S4), the ECU 30 performs output normal control (step S5). For example, the ECU 30 performs, as the output normal control, throttle control for a throttle opening corresponding to the voltage values Va and Vb output from the substrate 20.

On the other hand, in a case where the preset relation is not satisfied, for example, the absolute value of the difference between the voltage values Va and Vb is equal to or more than the threshold value (Yes at step S2), that is, in a case where the change in the graph as indicated by symbols Va' and Vb' shown at the time of an external magnetic field approaching of FIG. 4 is seen, the anomaly detection circuit 25 detects the influence of an external magnetic field. In this case, for example, the anomaly detection circuit 25 outputs anomaly signals to the amplifiers 23 and 24, the anomaly signals are transmitted from the amplifiers 23 and 24 to the ECU 30, and the ECU 30 performs the output anomaly control (step S6). For example, the ECU 30 performs the output anomaly control set in case of detection of the influence of an external magnetic field such as the throttle control being stopped.

As described above, the throttle device according to this example embodiment is configured to detect, by the two magnetic sensors, the mutually opposite directions of magnetic fluxes generated by the magnet 10 rotating together with the throttle grip 1, and therefore, can effectively detect the influence of an external magnetic field by the two magnetic sensors. Thus, it is possible to suppress complication of the structure and increase in the number of parts, and appropriately respond to the influence of an external magnetic field.

Modification Example

Although the case where the end surface of the magnet 10 is radially divided into four and the magnetic poles are formed is illustrated above, the magnet 10 may have another configuration. For example, as shown in FIG. 9, the end surface of the magnet 10 may be radially divided into eight and the N poles and the S poles may be alternately formed in order in the rotation direction T. Then, the first sensor 21 and the second sensor 22 may be arranged so as to face the end surface of the magnet 10 thus configured and detect magnetic fluxes heading opposite each other along the rotation direction T as described above. At this time, as shown in FIG. 9, the first sensor 21 and the second sensor 22 do not necessarily need to be arranged so as to face a pair of magnetic poles placed adjacent to each other.

The configuration of the magnet 10 shown in FIG. 9 is an example, and the magnet 10 is not necessarily limited to being radially divided and may have any configuration. For example, although the end face of the magnet 10 is radially divided to form multiple pairs of magnetic poles in the above description, a plurality of magnets 10, which are physically divided, may be provided to form at least two pairs of magnetic poles. Besides, the magnet 10 is not necessarily limited to having a pair of magnetic poles formed on the end surface of the cylindrical shape, and a pair of magnetic poles may be formed on the outer peripheral surface. Then, the sensor including the first sensor 21 and second sensor 22 described above may be arranged so as to face the magnetic poles.

Figure 3:
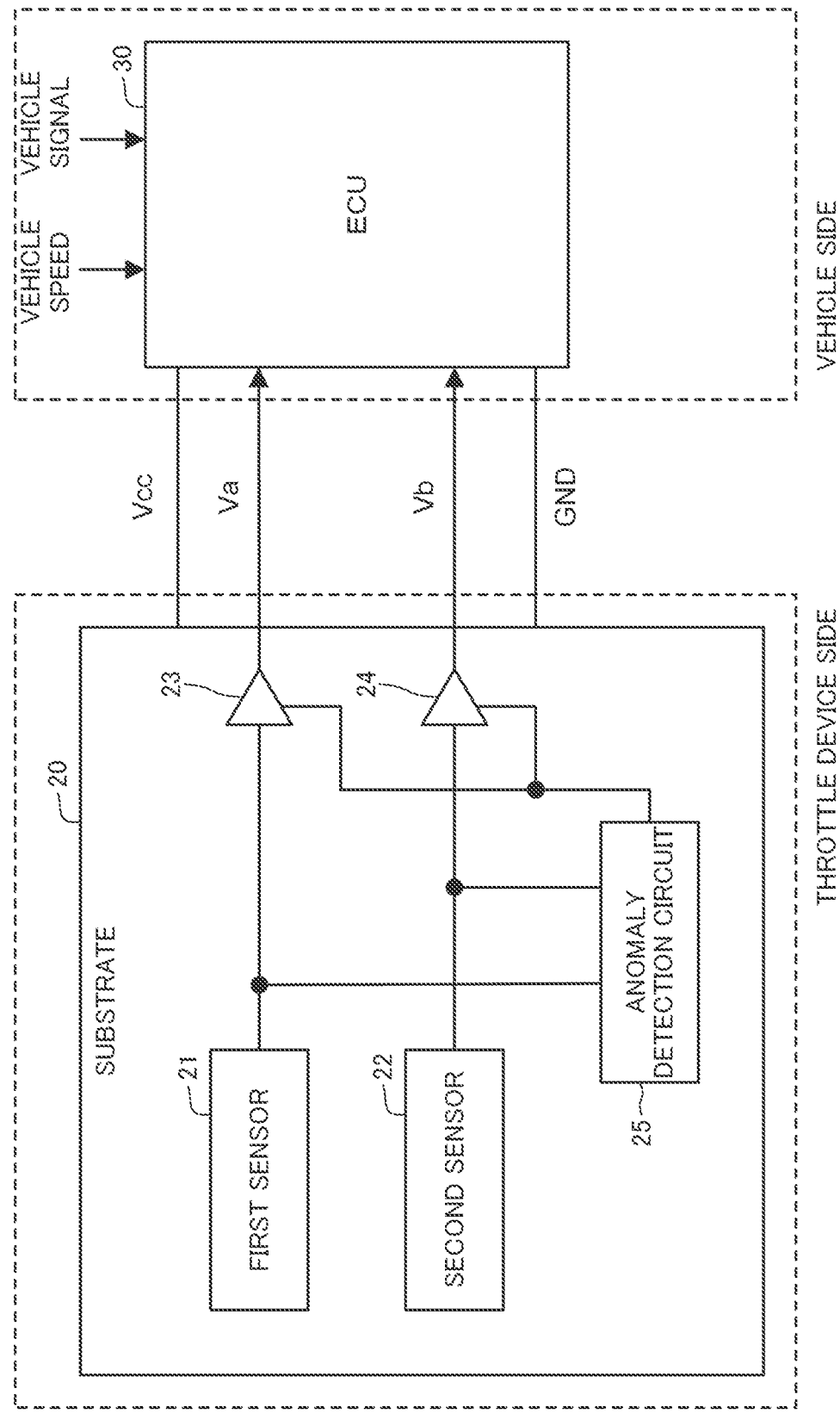
FIG. 3 is a block diagram showing the configuration of the position sensor disclosed in FIG. 1.

The functions of the amplifiers 23 and 24 and the anomaly detection circuit 25 shown in FIG. 3 may be included in the ECU 30 as indicated by reference numerals 23', 24', and 25' in FIG. 10.

Further, although the position sensor for detecting the rotation angle of a rotating body such as the throttle grip 1 detects the influence of an external magnetic field in the above description, the position sensor is not limited to a sensor for detecting the position in the rotation direction, and can also be applied to a position sensor that detects the position of a moving body which moves in any movement direction. For example, in the example shown in FIG. 5 described above, the rotation direction is replaced with the linear direction for description. In the case of detecting the position of a moving body which moves in the linear direction as in the description, it is possible to detect the movement position and also detect the influence of an external magnetic field.

<Supplementary Notes>

The whole or part of the example embodiments disclosed above can be described as the following supplementary notes. Below, the overview of the position sensor and the position detection method according to the present invention will be described. Meanwhile, the present invention is not limited to the following configurations.

(Supplementary Note 1)

A position sensor comprising:

a magnet configured to move together with a moving body and generate a first magnetic flux and a second magnetic flux, the first magnetic flux being along a specific movement direction of the moving body, the second magnetic flux being along an opposite direction to the specific movement direction of the moving body; and a sensor configured to detect a direction of the first magnetic flux and a direction of the second magnetic flux, wherein the magnet is configured by at least one magnet having at least two pairs of magnetic poles to be paired formed thereon.

According to the present invention, a magnet having at least two pairs of magnetic poles to be paired formed thereon and generating magnetic fluxes of mutually opposite directions is included, and a sensor detecting the directions of the magnetic fluxes of the mutually opposite directions is included. Since the sensor thus detects the directions of the magnetic fluxes of the mutually opposite directions along a movement direction, it is possible to detect a position along the movement direction of a moving object, and also effectively detect the influence of an external magnetic field which may occur in a specific direction. As a result, it is possible to inhibit complication of the structure and increase in the number of parts, and appropriately respond to the influence of the external magnetic field.

(Supplementary Note 2)

The position sensor according to Supplementary Note 1, wherein the sensor includes a first sensor and a second sensor, the first sensor being placed so as to detect the direction of the first magnetic flux generated by a first pair of the magnetic poles, the second sensor being placed so as to detect the direction of the second magnetic flux generated by a second pair of the magnetic poles.

According to the present invention, since the sensor includes two sensors, it is possible to effectively detect the external magnetic field with a simple configuration. As a result, it is possible to inhibit complication of the structure and increase in the number of parts, and appropriately respond to the influence of the external magnetic field.

(Supplementary Note 3)

The position sensor according to Supplementary Notes 1 to 2, wherein the specific movement direction is a specific rotation direction of the moving body.

(Supplementary Note 4)

The position sensor according to Supplementary Note 3, wherein:

the magnet has an end surface along a plane substantially orthogonal to a rotation axis in the specific rotation direction of the moving body, and has the at least two pairs of magnetic poles to be paired formed on the end surface; and the sensor is placed so as to face the end surface.

(Supplementary Note 5)

The position sensor according to Supplementary Note 4, wherein the magnet has at least four magnetic poles radially formed on the end surface.

According to the present invention, it is possible to detect a position in the rotation direction of the moving body, and also effectively detect the influence of an external magnetic field which may occur in a specific direction. Moreover, since two or more pairs of magnetic poles are formed on the end surface of the magnet, it is possible to cause the one magnet to generate magnetic fluxes of mutually opposite directions along the rotation direction. As a result, it is possible to inhibit complication of the structure and increase in the number of parts, and appropriately respond to the influence of the external magnetic field.

(Supplementary Note 6)

The position sensor according to any of Supplementary Notes 1 to 5, wherein the sensor is placed so that an angle between the direction of the first magnetic flux and the direction of the second magnetic flux, which are detected thereby, is from 90 degrees to 270 degrees.

According to the present invention, the sensor is placed so that the angle between the directions of the two magnetic fluxes detected by the sensor is a specific angle. Consequently, it is possible to more effectively detect the influence of an external magnetic field which may occur in a specific direction.

(Supplementary Note 7)

The position sensor according to Supplementary Notes 1 to 6, further comprising a detector configured to detect an influence of an external magnetic field based on a detection value of the direction of the first magnetic flux detected by the sensor and a detection value of the direction of the second magnetic flux detected by the sensor.

(Supplementary Note 8)

The position sensor according to Supplementary Notes 1 to 7, wherein the detector is configured to detect the influence of the external magnetic field based on a change in a preset relation between the detection value of the direction of the first magnetic flux and the detection value of the direction of the second magnetic flux.

According to the present invention, it is possible to automatically detect the influence of the external magnetic field from the detection values detected by the detector, and it is possible to appropriately respond to the influence of the external magnetic field.

(Supplementary Note 9)

The position sensor according to Supplementary Notes 1 to 8, wherein the moving body is a throttle grip of a vehicle.

According to the present invention, it is possible to detect the rotation angle of a throttle grip of a vehicle, and also effectively detect the influence of an external magnetic force which may occur in a specific direction.

(Supplementary Note 10)

A position detection method comprising detecting a direction of a first magnetic flux and a direction of a second magnetic flux, the first magnetic flux and the second magnetic flux being generated by at least one magnet, the magnet moving together with a moving body and having at least two pairs of magnetic poles to be paired formed thereon, the first magnetic flux being along a specific movement direction of the moving body, the second magnetic flux being along an opposite direction to the specific movement direction of the moving body.

(Supplementary Note 11)

The position detection method according to Supplementary Note 10, comprising detecting an influence of an external magnetic field based on a detection value of the detected direction of the first magnetic flux and a detection value of the detected direction of the second magnetic flux.

According to the present invention, in the same manner as the abovementioned position sensor, it is possible to detect a position along the movement direction of a moving object, and also effectively detect the influence of an external magnetic field which may occur in a specific direction. As a result, it is possible to inhibit complication of the structure and increase in the number of parts, and appropriately respond to the influence of the external magnetic field.

Although the present invention is described above with reference to the example embodiments and so on, the present invention is not limited to the example embodiments. The configurations and details of the present invention can be changed in various manners that can be understood by one skilled in the art within the scope of the present invention.

DESCRIPTION OF NUMERALS 1 throttle grip
2 handlebar
10 magnet
20 substrate
21 first sensor
22 second sensor
23, 24 amplifier
25 anomaly detection circuit
30 ECU

The invention claimed is:

1. A position sensor comprising:
 a magnet configured to move together with a moving body and generate a first magnetic flux and a second magnetic flux, the first magnetic flux being along a specific movement direction of the moving body, the second magnetic flux being along an opposite direction to the specific movement direction of the moving body; and
 a sensor configured to detect a direction of the first magnetic flux and a direction of the second magnetic flux, wherein the sensor includes a first sensor and a second sensor, the first sensor being placed so as to detect the direction of the first magnetic flux, the second sensor being placed so as to detect the direction of the second magnetic flux, wherein:
the magnet is configured by at least one magnet having at least two pairs of magnetic poles to be paired formed thereon, the first magnetic flux generated by a first pair of the magnetic poles and the second magnetic flux generated by a second pair of the magnetic poles,
the first sensor and second sensor are placed so that an angle between the direction of the first magnetic flux and the direction of the second magnetic flux, which are detected thereby, is from 90 degrees to 270 degrees, and
the position sensor is capable of detecting an influence of an external magnetic field based on a detection value of the direction of the first magnetic flux detected by the first sensor and a detection value of the direction of the second magnetic flux detected by the second sensor.

2. The position sensor according to claim 1, wherein the specific movement direction is a specific rotation direction of the moving body.

3. The position sensor according to claim 2, wherein:
the magnet has an end surface along a plane substantially orthogonal to a rotation axis in the specific rotation direction of the moving body, and has the at least two pairs of magnetic poles to be paired formed on the end surface; and
the sensor is placed so as to face the end surface.

4. The position sensor according to claim 3, wherein the magnet has at least four magnetic poles radially formed on the end surface.

5. The position sensor according to claim 4, further comprising a detector configured to detect an influence of an external magnetic field based on a detection value of the direction of the first magnetic flux detected by the sensor and a detection value of the direction of the second magnetic flux detected by the sensor.

6. The position sensor according to claim 5, wherein the detector is configured to detect the influence of the external magnetic field based on a change in a preset relation between the detection value of the direction of the first magnetic flux and the detection value of the direction of the second magnetic flux.

7. The position sensor according to claim 6, wherein the moving body is a throttle grip of a vehicle.

8. A position detection method comprising
detecting a direction of a first magnetic flux and a direction of a second magnetic flux, the first magnetic flux and the second magnetic flux being generated by at least one magnet, the magnet moving together with a moving body and having at least two pairs of magnetic poles to be paired formed thereon, the first magnetic flux being along a specific movement direction of the moving body, the second magnetic flux being along an opposite direction to the specific movement direction of the moving body, and
detecting an influence of an external magnetic field based on a detection value of the detected direction of the first magnetic flux and a detection value of the detected direction of the second magnetic flux,
wherein an angle between the direction of the first magnetic flux and the direction of the second magnetic flux is from 90 degrees to 270 degrees.

* * * * *